(12) United States Patent
Wu

(10) Patent No.: US 8,467,238 B2
(45) Date of Patent: Jun. 18, 2013

(54) DYNAMIC PULSE OPERATION FOR PHASE CHANGE MEMORY

(75) Inventor: Chao-I Wu, Jhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 154 days.

(21) Appl. No.: 12/946,636

(22) Filed: Nov. 15, 2010

(65) Prior Publication Data
US 2012/0120723 A1 May 17, 2012

(51) Int. Cl.
*G11C 11/00* (2006.01)
(52) U.S. Cl.
USPC .......................................... 365/163; 365/158
(58) Field of Classification Search
USPC ................................. 365/163, 158
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 3,846,767 A | 11/1974 | Cohen |
| 3,922,648 A | 11/1975 | Buckley |
| 4,225,946 A | 9/1980 | Neale et al. |
| 4,228,524 A | 10/1980 | Neale et al. |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi |
| 5,391,901 A | 2/1995 | Tanabe |
| 5,515,488 A | 5/1996 | Hoppe et al. |
| 5,534,712 A | 7/1996 | Ovshinsky et al. |
| 5,550,396 A | 8/1996 | Tsutsumi |
| 5,687,112 A | 11/1997 | Ovshinsky |
| 5,688,713 A | 11/1997 | Linliu et al. |
| 5,716,883 A | 2/1998 | Tseng |
| 5,754,472 A | 5/1998 | Sim |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |

(Continued)

FOREIGN PATENT DOCUMENTS

WO 2004025659 A1 3/2004

OTHER PUBLICATIONS

Wuttig, Matthias, "Towards a Universal Memory?" Nature Materials, Apr. 2005, pp. 265-266, vol. 4.

(Continued)

*Primary Examiner* — Michael Tran
(74) *Attorney, Agent, or Firm* — Kenta Suzue; Haynes Beffel & Wolfeld LLP

(57) ABSTRACT

The control circuit performs a reset operation and a set operation that change the resistance states of phase change memory cells of the array. The control circuit changes at least one parameter, of at least one of the reset operation and the set operation for future operations. This change is responsive to an indicator of degraded memory state retention of the array.

18 Claims, 8 Drawing Sheets

U.S. PATENT DOCUMENTS

| | | |
|---|---|---|
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji |
| 6,066,870 A | 5/2000 | Siek |
| 6,075,719 A | 6/2000 | Lowrey et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,512,263 B1 | 1/2003 | Yuan et al. |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Chen |
| 6,687,307 B1 | 2/2004 | Anikhindi et al. |
| 6,744,088 B1 | 6/2004 | Dennison |
| 6,750,079 B2 | 6/2004 | Lowrey et al. |
| 6,750,101 B2 | 6/2004 | Lung |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,838,692 B1 | 1/2005 | Lung |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg |
| 6,992,932 B2 | 1/2006 | Cohen |
| 6,998,289 B2 | 2/2006 | Hudgens et al. |
| 7,023,008 B1 | 4/2006 | Happ |
| 7,023,009 B2 | 4/2006 | Kostylev et al. |
| 7,033,856 B2 | 4/2006 | Lung |
| 7,038,230 B2 | 5/2006 | Chen et al. |
| 7,038,938 B2 | 5/2006 | Kang |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung |
| 7,078,273 B2 | 7/2006 | Matsuoka et al. |
| 7,085,154 B2 | 8/2006 | Cho et al. |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,126,847 B2 | 10/2006 | Ha et al. |
| 7,132,675 B2 | 11/2006 | Gilton |
| 7,151,273 B2 | 12/2006 | Campbell et al. |
| 7,154,774 B2 | 12/2006 | Bedeschi et al. |
| 7,158,411 B2 | 1/2007 | Yeh et al. |
| 7,164,147 B2 | 1/2007 | Lee et al. |
| 7,166,533 B2 | 1/2007 | Happ |
| 7,169,635 B2 | 1/2007 | Kozicki |
| 7,190,607 B2 | 3/2007 | Cho et al. |
| 7,202,493 B2 | 4/2007 | Lung |
| 7,208,751 B2 | 4/2007 | Ooishi |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |

| | | |
|---|---|---|
| 7,248,494 B2 | 7/2007 | Oh et al. |
| 7,251,157 B2 | 7/2007 | Osada et al. |
| 7,253,429 B2 | 8/2007 | Klersy et al. |
| 7,254,059 B2 | 8/2007 | Li et al. |
| 7,262,502 B2 | 8/2007 | Chang |
| 7,269,052 B2 | 9/2007 | Segal et al. |
| 7,277,317 B2 | 10/2007 | Le Phan |
| 7,289,351 B1 | 10/2007 | Chen et al. |
| 7,291,556 B2 | 11/2007 | Choi et al. |
| 7,309,630 B2 | 12/2007 | Fan et al. |
| 7,314,776 B2 | 1/2008 | Johnson et al. |
| 7,317,201 B2 | 1/2008 | Gutsche et al. |
| 7,321,130 B2 | 1/2008 | Lung et al. |
| 7,323,708 B2 | 1/2008 | Lee et al. |
| 7,323,734 B2 | 1/2008 | Ha et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung |
| 7,365,385 B2 | 4/2008 | Abbott |
| 7,379,328 B2 | 5/2008 | Osada et al. |
| 7,385,235 B2 | 6/2008 | Lung |
| 7,388,273 B2 | 6/2008 | Burr et al. |
| 7,394,088 B2 | 7/2008 | Lung |
| 7,397,060 B2 | 7/2008 | Lung |
| 7,400,522 B2 | 7/2008 | Toda et al. |
| 7,423,300 B2 | 9/2008 | Lung et al. |
| 7,426,134 B2 | 9/2008 | Happ et al. |
| 7,440,308 B2 | 10/2008 | Jeong et al. |
| 7,449,710 B2 | 11/2008 | Lung |
| 7,473,576 B2 | 1/2009 | Lung |
| 7,479,649 B2 | 1/2009 | Lung |
| 7,485,891 B2 | 2/2009 | Hamann et al. |
| 7,488,968 B2 | 2/2009 | Lee |
| 7,502,252 B2 | 3/2009 | Fuji et al. |
| 7,505,330 B2 | 3/2009 | Pawlowski et al. |
| 7,507,986 B2 | 3/2009 | Lung |
| 7,514,334 B2 | 4/2009 | Chen et al. |
| 7,514,705 B2 | 4/2009 | Breitwisch et al. |
| 7,515,461 B2 | 4/2009 | Happ et al. |
| 7,539,050 B2 | 5/2009 | Philipp et al. |
| 7,558,105 B2 | 7/2009 | Suh |
| 7,569,844 B2 | 8/2009 | Lung |
| 7,571,901 B2 | 8/2009 | Philipp |
| 7,577,024 B2 | 8/2009 | Fackenthal et al. |
| 7,580,277 B2 | 8/2009 | Fuji |
| 7,656,701 B2 | 2/2010 | Lee et al. |
| 7,679,954 B2 * | 3/2010 | Lee et al. ................ 365/163 |
| 7,683,360 B2 | 3/2010 | Chen et al. |
| 7,688,619 B2 | 3/2010 | Lung et al. |
| 7,696,503 B2 | 4/2010 | Lung et al. |
| 7,701,759 B2 | 4/2010 | Lung et al. |
| 7,751,227 B2 | 7/2010 | Fuji |
| 7,767,993 B2 | 8/2010 | Toda et al. |
| 7,796,424 B2 | 9/2010 | Happ et al. |
| 7,826,248 B2 | 11/2010 | Xi et al. |
| 7,868,313 B2 | 1/2011 | Breitwisch et al. |
| 7,894,254 B2 * | 2/2011 | Lung ........................ 365/163 |
| 8,017,929 B2 * | 9/2011 | Kang et al. ................. 257/2 |
| 2002/0017701 A1 | 2/2002 | Klersy et al. |
| 2002/0070457 A1 | 6/2002 | Sun et al. |
| 2002/0113273 A1 | 8/2002 | Hwang et al. |
| 2002/0168852 A1 | 11/2002 | Harshfield et al. |
| 2003/0072195 A1 | 4/2003 | Mikolajick |
| 2003/0095426 A1 | 5/2003 | Hush et al. |
| 2003/0116794 A1 | 6/2003 | Lowrey |
| 2003/0186481 A1 | 10/2003 | Lung |
| 2004/0026686 A1 | 2/2004 | Lung |
| 2004/0051094 A1 | 3/2004 | Ooishi |
| 2004/0113137 A1 | 6/2004 | Lowrey |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0052904 A1 | 3/2005 | Cho et al. |
| 2005/0062087 A1 | 3/2005 | Chen et al. |
| 2005/0093022 A1 | 5/2005 | Lung |
| 2005/0127347 A1 | 6/2005 | Choi et al. |
| 2005/0127349 A1 | 6/2005 | Horak et al. |
| 2005/0141261 A1 | 6/2005 | Ahn |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0195633 A1 | 9/2005 | Choi et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2005/0275433 A1 | 12/2005 | Lee |
| 2006/0006472 A1 | 1/2006 | Jiang |
| 2006/0018156 A1 | 1/2006 | Happ |
| 2006/0034112 A1 | 2/2006 | Oh et al. |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157680 A1 | 7/2006 | Takaura et al. |
| 2006/0157681 A1 | 7/2006 | Chen et al. |
| 2006/0163554 A1 | 7/2006 | Lankhorst et al. |
| 2006/0169968 A1 | 8/2006 | Happ |
| 2006/0172067 A1 | 8/2006 | Ovshinsky et al. |
| 2006/0175599 A1 | 8/2006 | Happ |
| 2006/0190672 A1 * | 8/2006 | Fuji ............................. 711/100 |
| 2006/0192193 A1 | 8/2006 | Lee et al. |
| 2006/0198183 A1 | 9/2006 | Kawahara et al. |
| 2006/0202245 A1 | 9/2006 | Zuliani et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0245236 A1 | 11/2006 | Zaidi |
| 2006/0250885 A1 | 11/2006 | Cho et al. |
| 2006/0261392 A1 | 11/2006 | Lee et al. |
| 2006/0266993 A1 | 11/2006 | Suh et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289847 A1 | 12/2006 | Dodge |
| 2006/0289848 A1 | 12/2006 | Dennison |
| 2007/0007613 A1 | 1/2007 | Wang et al. |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0040159 A1 | 2/2007 | Wang |
| 2007/0045606 A1 | 3/2007 | Magistretti et al. |
| 2007/0051936 A1 | 3/2007 | Pellizzer et al. |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |

| | | |
|---|---|---|
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0140029 A1 | 6/2007 | Kim et al. |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0252127 A1 | 11/2007 | Arnold et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0106923 A1 | 5/2008 | Lung |
| 2008/0137400 A1 | 6/2008 | Chen et al. |
| 2008/0138929 A1 | 6/2008 | Lung |
| 2008/0138930 A1 | 6/2008 | Lung |
| 2008/0138931 A1 | 6/2008 | Lung |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0175042 A1* | 7/2008 | Kang et al. .................... 365/163 |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2008/0265234 A1 | 10/2008 | Lung |
| 2008/0303014 A1 | 12/2008 | Goux et al. |
| 2008/0310208 A1 | 12/2008 | Daley |
| 2009/0001341 A1 | 1/2009 | Breitwisch et al. |
| 2009/0014704 A1 | 1/2009 | Chen et al. |
| 2009/0023242 A1 | 1/2009 | Lung |
| 2009/0027950 A1 | 1/2009 | Lam et al. |
| 2009/0042335 A1 | 2/2009 | Lung |
| 2009/0057641 A1 | 3/2009 | Lung |
| 2009/0072215 A1 | 3/2009 | Lung et al. |
| 2009/0098678 A1 | 4/2009 | Lung |
| 2009/0166603 A1 | 7/2009 | Lung |
| 2009/0268507 A1 | 10/2009 | Breitwisch et al. |
| 2009/0273968 A1 | 11/2009 | Lamorey et al. |
| 2009/0289242 A1 | 11/2009 | Breitwisch et al. |
| 2009/0294748 A1 | 12/2009 | Breitwisch et al. |
| 2010/0055830 A1 | 3/2010 | Chen et al. |
| 2010/0084624 A1 | 4/2010 | Lung et al. |
| 2010/0144128 A1 | 6/2010 | Lung et al. |
| 2010/0151652 A1 | 6/2010 | Lung et al. |
| 2010/0157665 A1 | 6/2010 | Lung et al. |
| 2010/0193763 A1 | 8/2010 | Chen et al. |
| 2010/0270529 A1 | 10/2010 | Lung |
| 2010/0291747 A1 | 11/2010 | Lung et al. |
| 2010/0328995 A1 | 12/2010 | Shih et al. |
| 2010/0328996 A1 | 12/2010 | Shih et al. |
| 2011/0013446 A1 | 1/2011 | Lung |
| 2011/0034003 A1 | 2/2011 | Lung |
| 2011/0049456 A1 | 3/2011 | Lung et al. |

OTHER PUBLICATIONS

Yamada, Noboru, "Potential of Ge-Sb-Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM Dec. 10, 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

"Magnetic Bit Boost," www.sciencenews.org, Dec. 18-25, 2004, p. 389, vol. 166.

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, FL, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM Dec. 13-15, 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, published at least as early as Dec. 1997, pp. 1-6.

Bedeschi, F. et al., "4-MB MOSFET-Selected Phase-Change Memory Experimental Chip," IEEE, Sep. 21-23, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7 2005, 4 pp.

Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," Feb. 3-7, 2002 IEEE-ISSCC Technical Digest (TD 12.4), 7 pp.

Gleixner, "Phase Change Memory Reliability", 22nd NVSMW, Aug. 26, 2007, 46 pages.

Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.

Hanzawa, Satoru, et al., "A 512kB Embedded Phase Change Memory with 416kB/s Write Throughput at 100mA Cell Write Current," ISSCC 2007, Session 26, Non-Volatile Memories/26.2, 3 pages.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," Jun. 10-12, 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, Apr. 17-21, 2005, pp. 157-162.

Lacita, A. L., "Electrothermal and Phase-change Dynamics in Chalcogenide-based Memories," IEEE IEDM Dec. 13-15, 2004, 4 pp.

Lai, Stefan, "Current Status of the Phase Change Memory and Its Future," IEEE IEDM Dec. 10, 2003, pp. 255-258.

Lai, Stephan et al., "OUM-A 180 nm Nonvolatile Memory Cell Element Technology for Stand Alone and Embedded Applications," IEEE IEDM Dec. 2-5, 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Li, Yiming, "Temperature dependence on the contact size of GeSbTe films for phase change memories," J. Comput Electron (2008) 7:138-141.

Mott, Nevill, "Electrons in Glass," Nobel Lecture, Dec. 8, 1977, Physics, 1977, pp. 403-413.

Oh, Hyung-Rok, et al., "Enhanced Write Performance of a 64Mb Phase-Change Random Access Memory," ISSCC 2005, Session 2, Non-Volatile Memory, 2.3, 3 pages.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," Jun. 15-17, 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n. Junctions Using Vapor Phase Doping for Application in Multi-Resurf Devices," IEEE Jun. 4-7, 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE Mar. 18-25, 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20 high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era-vol. 4, pp. 674-679, 2004.

* cited by examiner

DYNAMIC PULSE OPERATION FOR PHASE CHANGE MEMORY

PARTIES TO A RESEARCH AGREEMENT

International Business Machines Corporation, a New York corporation and Macronix International Corporation, Ltd., a Taiwan corporation, are parties to a Joint Research Agreement.

BACKGROUND

1. Field of the Invention

This technology relates to phase change memory cells.

2. Description of Related Art

Phase change memory cells degrade with continued regular operation. It is believed that the degradation is caused by the flow of current through the phase change memory cell. A result of degradation is that, the resistance of the amorphous state decreases and the resistance of the crystalline state decreases.

In application Ser. No. 12/286,874, a mesh of phase change material and dielectric material is formed to control the formation of particular crystalline phases of phase change material. Such controlled formation of particular crystalline phases limits the volume of phase change material which undergoes the change between the amorphous state and the crystalline state. Nevertheless, this volume continues to undergo stress. This shares a common feature of many memory algorithms that adjust the operation of a phase change memory array once, and then continue without adjustment thereafter during regular operation of the phase change memory array.

Memory verify algorithms generally adjust the operation of a phase change memory array, upon a demonstrated failure of the phase change memory array. However, it is costly in time and throughput to rely on such demonstrated failure before every algorithm adjustment, particularly if the cause of the failure is widespread among many memory cells in an array, rather than limited to only a small number of memory cells in an array.

SUMMARY

One aspect of the technology is a memory device, with an array of phase change memory cells and a control circuit coupled to the array.

The array of phase change memory cells has an amorphous phase corresponding to a first resistance state and a crystalline phase corresponding to a second resistance state.

The control circuit performs a reset operation and a set operation that change the resistance states of the array. The control circuit changes at least one parameter, of at least one of the reset operation and the set operation for future operations. This change is responsive to an indicator of degraded memory state retention of at least part of the array. In several embodiments, the reset operation changes at least one phase change memory cell in the array to the amorphous phase, and the set operation changes at least one phase change memory cell in the array to the crystalline phase.

In some embodiments, the indicator of degraded memory state retention is a number of lifetime cycles of the reset operation and/or the set operation performed on at least part of the array. An advantage of defining the indicator of degraded memory state retention based on the number of set operations, is that the set operation is performed on multiple word lines at a time.

In some embodiment, the control circuit changes a total period of applying energy to at least part of the array as the number of lifetime cycles increases. For example, the control circuit causes the set operation to apply energy to at least part of the array for a shorter total period as the number of lifetime cycles increases. In another example, control circuit causes the reset operation to apply energy to at least part of the array for a longer total period as the number of lifetime cycles increases.

In some embodiment, the control circuit changes a current applied to at least part of the array as the number of lifetime cycles increases. For example, the control circuit causes the set operation to apply a lower current to at least part of the array as the number of lifetime cycles increases. In another example, the control circuit causes the reset operation to apply a higher current to at least part of the array as the number of lifetime cycles increases.

In one embodiment, the control circuit changes a total energy applied to at least part of the array as the number of lifetime cycles increases.

In some embodiments, the indicator of degraded memory state retention is set resistance, which decreases with cycling.

Another aspect of the technology is a method of operating a memory device, comprising the following step(s):

responsive to an indicator of degraded memory state retention of an array of phase change memory cells having an amorphous phase corresponding to a first resistance state and a crystalline phase corresponding to a second resistance state, changing at least one parameter of at least one of a reset operation and a set operation that changes the resistance states of at least part of the array for future operations.

In some embodiments, the indicator of degraded memory state retention is a number of lifetime cycles of the reset operation and/or the set operation performed on at least part of the array. An advantage of defining the indicator of degraded memory state retention based on the number of set operations, is that the set operation is performed on multiple word lines at a time.

In some embodiment, the method changes a total period of applying energy to at least part of the array as the number of lifetime cycles increases. For example, the method causes the set operation to apply energy to at least part of the array for a shorter total period as the number of lifetime cycles increases. In another example, method causes the reset operation to apply energy to at least part of the array for a longer total period as the number of lifetime cycles increases.

In some embodiment, the method changes a current applied to at least part of the array as the number of lifetime cycles increases. For example, the method causes the set operation to apply a lower current to at least part of the array as the number of lifetime cycles increases. In another example, the method causes the reset operation to apply a higher current to at least part of the array as the number of lifetime cycles increases.

In one embodiment, the method changes a total energy applied to at least part of the array as the number of lifetime cycles increases.

In some embodiments, the indicator of degraded memory state retention is set resistance, which decreases with cycling.

DETAILED DESCRIPTION

Figure 1:
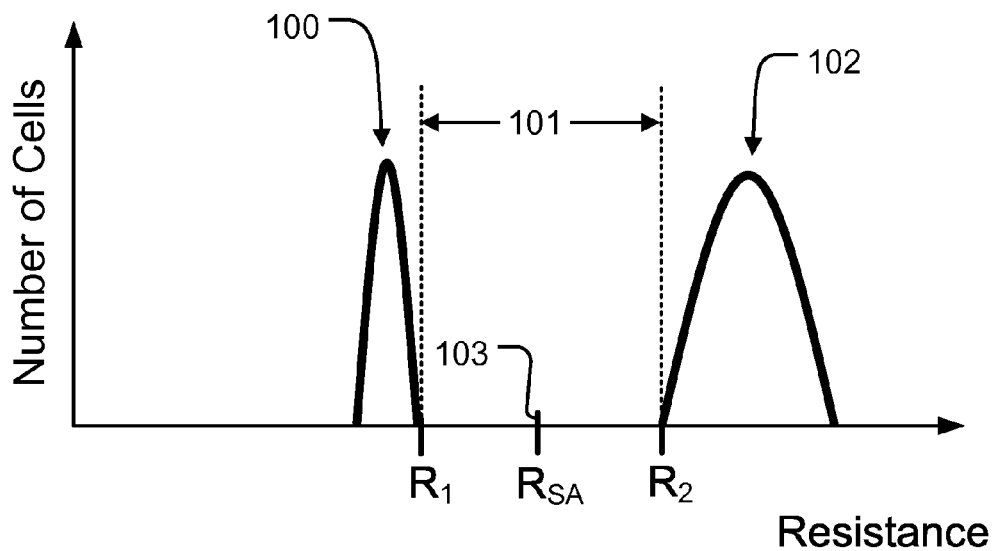
FIG. 1 shows a distribution of memory cells in different states.

FIG. 1 shows a distribution of memory cells in different states.

The SET state and RESET state each have a separate distribution of memory cells with different ranges of resistance. The low distribution of resistance 100 has an upper bound of resistance R1. The high distribution of resistance 102 has a lower bound of resistance R2. The sense amplifier distinguishes the state of a memory cell by determining whether the resistance is lower or higher than the resistance RSA between R1 and R2.

Figure 2:
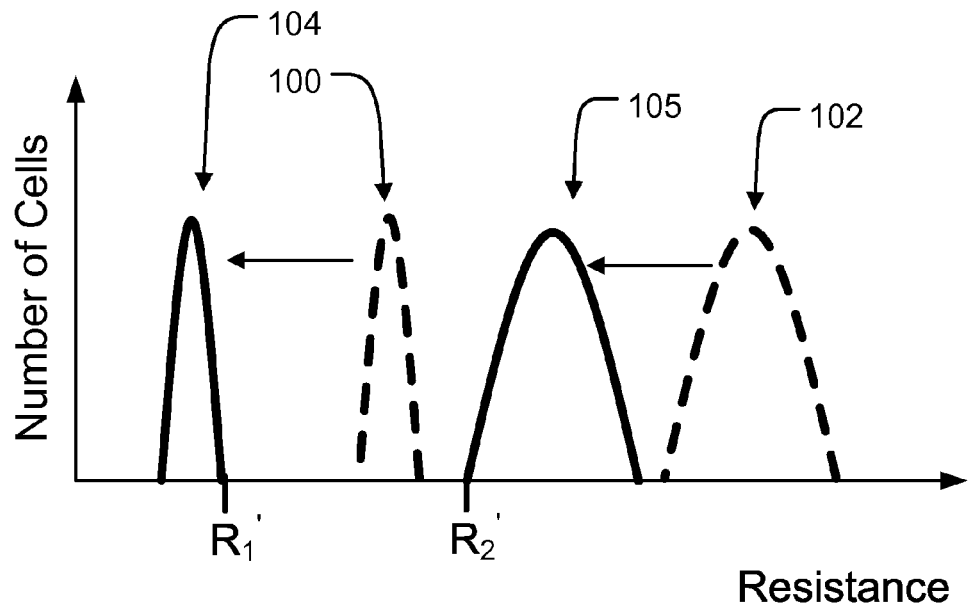
FIG. 2 shows another distribution of memory cells in different states, following degradation of memory retention.

FIG. 2 shows another distribution of memory cells in different states, following degradation of memory retention.

Because of degradation of memory retention, the low distribution of resistance 100 has fallen to degraded low distribution 104, with an upper bound of resistance R1'. The degraded upper bound of resistance R1' is significantly below the original upper bound of resistance R1. Also because of degradation of memory retention, the high distribution of resistance 102 has fallen to degraded high distribution 105, with a lower bound of resistance R2'. The degraded lower bound of resistance R2' is significantly below the original lower bound of resistance R2.

Because of the degraded distributions of resistance, if the sense amplifier continued to rely on the resistance RSA to distinguish between the possible states of a memory cell, numerous errors will result. The resistance RSA will result in the sense amplifier determining that memory cells fall in the low distribution of resistance 100, when the memory cells are actually in the degraded high distribution 105.

Various embodiments help to suppress the degraded memory retention shown in FIGS. 1 and 2, with the accompanying errors in sense amplifier operation.

Figure 3:
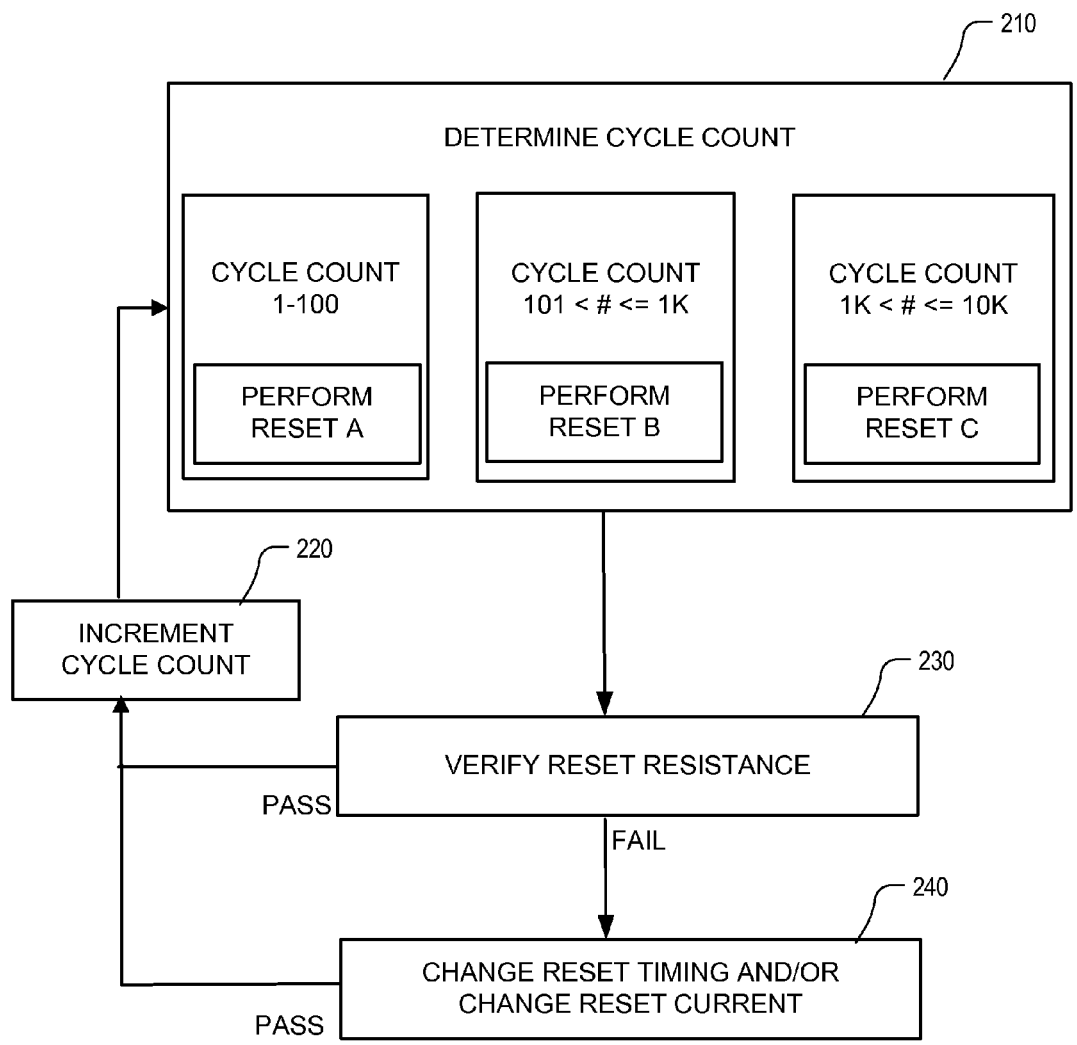
FIG. 3 shows a flowchart of a memory cell operation for a RESET operation, to address degradation of memory retention.

FIG. 3 shows a flowchart of a memory cell operation for a RESET operation, to address degradation of memory retention.

At 210, the cycle count is determined, and responsive to the cycle count the particular operation is performed. The particular RESET operation is determined, responsive to the cycle count range in which the cycle count falls. In the shown embodiment, there are three cycles count ranges: 1-100, 101<#<=1K, and 1K<#<=10K.

Other embodiments vary the number of cycle count ranges, and vary the endpoints of the cycle count ranges. More ranges improve retention due to less current stress on the programmable resistive material.

If the cycle count falls in the range 1-100, then operation RESET A is performed. If the cycle count falls in the range 101<#<=1K, then operation RESET B is performed. If the cycle count falls in the range 1K<#<=10K, then operation RESET C is performed.

In 230, the verify RESET resistance operation is performed. If the RESET resistance is acceptable, then the verify operation is passed. The cycle count is incremented in 220, and the process starts over. If the RESET resistance is unacceptable, then the verify operation is failed. In 240, the RESET timing and/or RESET current is changed. The cycle count is incremented in 220, and the process starts over (with the RESET operation being repeated on the failed memory cell as necessary).

Figure 4:
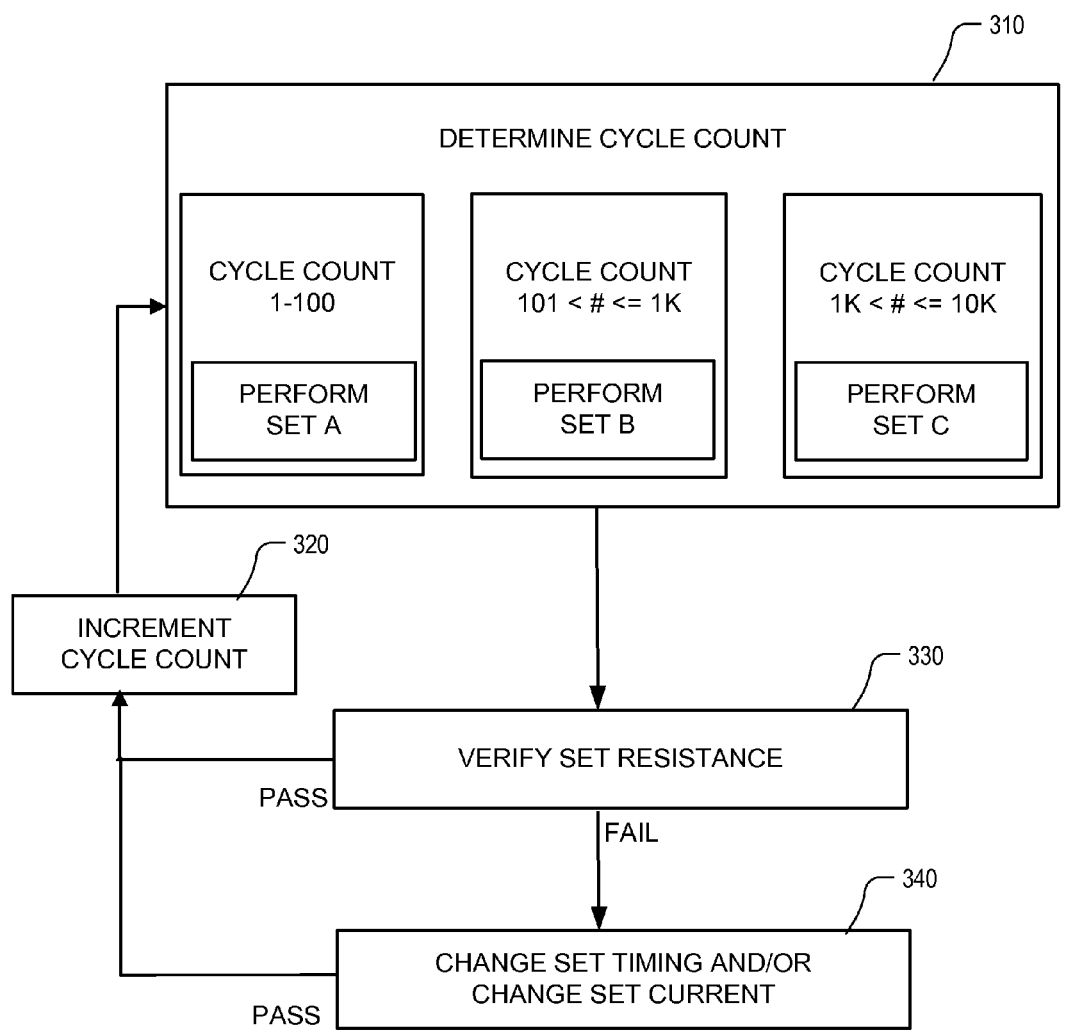
FIG. 4 shows a flowchart of a memory cell operation for a SET operation, to address degradation of memory retention.

FIG. 4 shows a flowchart of a memory cell operation for a SET operation, to address degradation of memory retention.

At 310, the cycle count is determined, and responsive to the cycle count the particular operation is performed. The particular SET operation is determined, responsive to the cycle count range in which the cycle count falls. In the shown embodiment, there are three cycles count ranges: 1-100, 101<#<=1K, and 1K<#<=10K.

Other embodiments vary the number of cycle count ranges, and vary the endpoints of the cycle count ranges.

If the cycle count falls in the range 1-100, then operation SET A is performed. If the cycle count falls in the range 101<#<=1K, then operation SET B is performed. If the cycle count falls in the range 1K<#<=10K, then operation SET C is performed.

In 330, the verify SET resistance operation is performed. If the SET resistance is acceptable, then the verify operation is passed. The cycle count is incremented in 320, and the process starts over. If the SET resistance is unacceptable, then the verify operation is failed In 340, the SET timing and/or SET current is changed. The cycle count is incremented in 320, and the process starts over (with the SET operation being repeated on the failed memory cell as necessary).

In some embodiments, the indicator of degraded memory state retention is set resistance, which decreases with cycling. In such embodiments, the cycle count ranges of FIGS. 3 and 4 are replaced with set resistance ranges.

Figure 5:
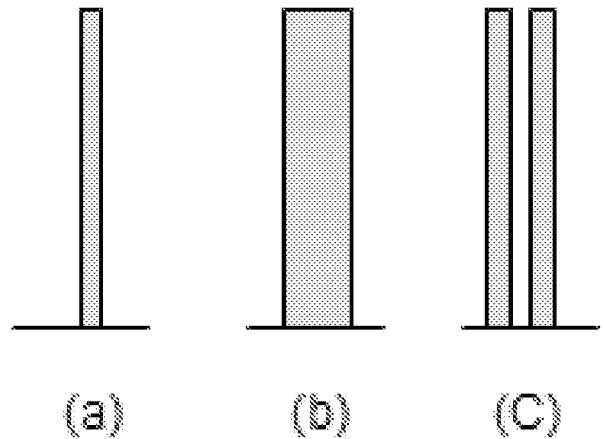
FIG. 5 shows various examples of varying a memory cell operation, including varying pulse length and pulse number.

FIG. 5 shows various examples of varying a memory cell operation, including varying pulse length and pulse number.

FIG. 5a shows a single pulse. In comparison, FIG. 5b shows a lengthened pulse, and FIG. 5c shows two pulses whose combined duration is lengthened. Both FIGS. 5b and 5c are examples of varying the total period of applying energy during an operation, and examples of varying the total energy, compared to the original operation of FIG. 5a.

Figure 6:
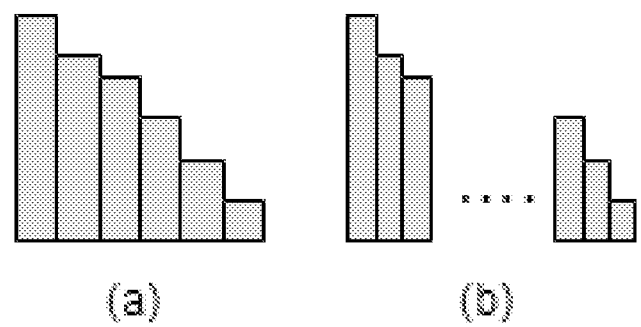
FIG. 6 shows additional various examples of varying a memory cell operation, including varying pulse length and pulse number, and stepped pulse values.

FIG. 6 shows additional various examples of varying a memory cell operation, including varying pulse length and pulse number, and stepped pulse values.

FIG. 6a shows six pulses with stepped down values. In comparison, FIG. 6b shows three pulses with stepped down values, with and another three pulses with stepped down values that start from a lower initial value. FIG. 6b also shows with the ellipses that intermediate beginning values occur. Accordingly, FIG. 6b shows examples of varying the total period of applying energy during an operation, examples of varying the total energy, and examples of varying the current, compared to the original operation of FIG. 6a.

Figure 7:
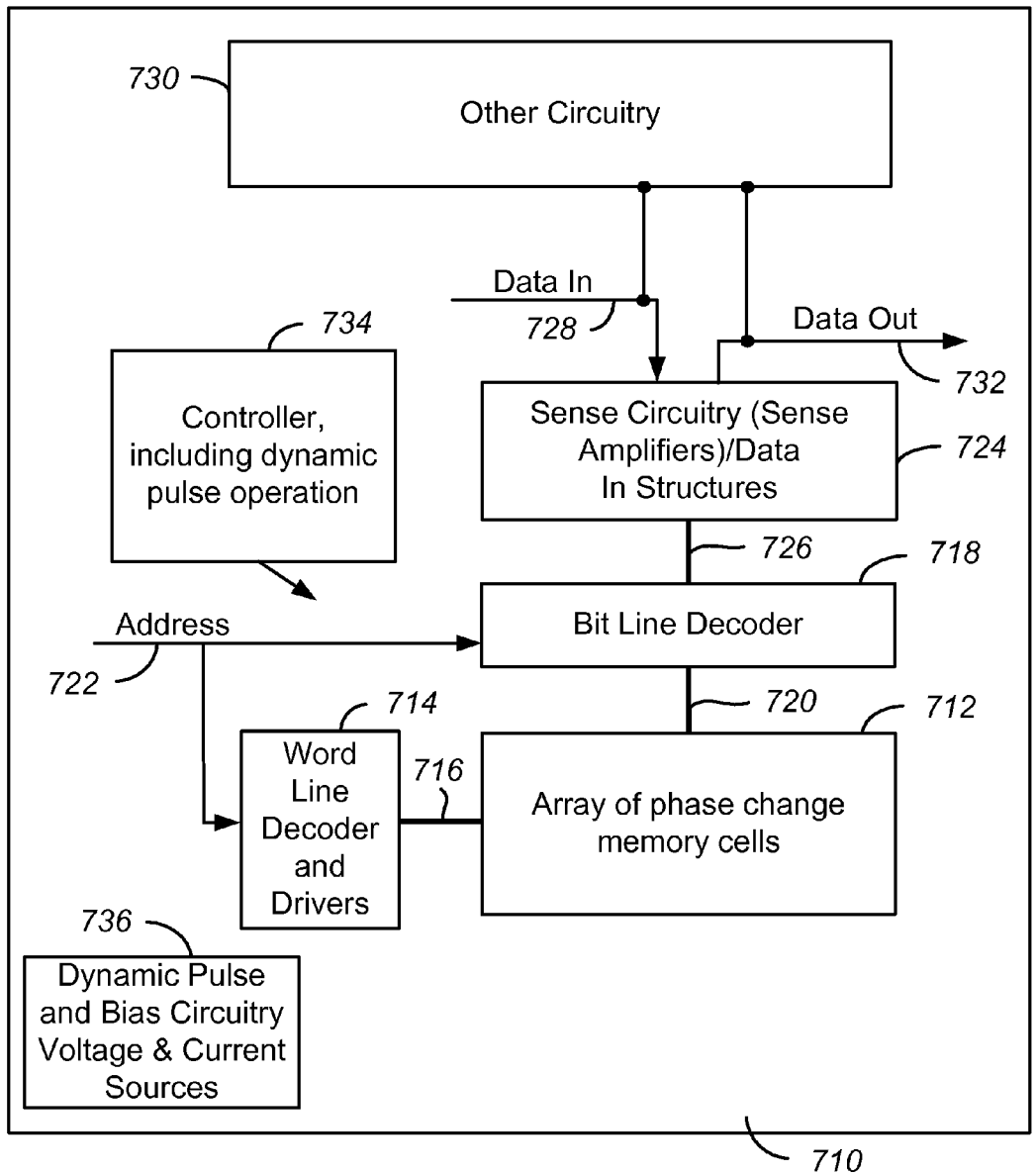
FIG. 7 is a simplified block diagram of an integrated circuit including an array of memory cells with improved control circuitry disclosed herein.

FIG. 7 is a simplified block diagram of an integrated circuit 710 including a memory array 712 implemented with improved control circuitry disclosed herein. A word line decoder 714 having read, set and reset modes is coupled to and in electrical communication with a plurality of word lines 716 arranged along rows in the memory array 712. A bit line (column) decoder 718 is in electrical communication with a plurality of bit lines 720 arranged along columns in the array 712 for reading, setting, and resetting the phase change memory cells (not shown) in array 712. Addresses are supplied on bus 722 to word line decoder and drivers 714 and bit line decoder 718. Sense circuitry (sense amplifiers) and data-in structures in block 724, including voltage and/or current sources for the read, set, and reset modes are coupled to bit line decoder 718 via data bus 726. Data is supplied via a data-in line 728 from input/output ports on integrated circuit 710, or from other data sources internal or external to integrated circuit 710, to data-in structures in block 724. Other circuitry 730 may be included on integrated circuit 710, such as a general purpose processor or special purpose application circuitry, or a combination of modules providing system-on-a-chip functionality supported by array 712. Data is supplied via a data-out line 732 from the sense amplifiers in block 724 to input/output ports on integrated circuit 710, or to other data destinations internal or external to integrated circuit 710.

A controller 734 implemented in this example, using a bias arrangement state machine, controls the application of bias circuitry voltage and current sources 736 for the application of bias arrangements including read, program, erase, erase verify and program verify voltages and/or currents for the word lines and bit lines. Controller 734 may be implemented using special-purpose logic circuitry as known in the art. In alternative embodiments, controller 734 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 734.

The controller includes a counter circuit to record the cycling count of each memory page, sector, or other unit of memory. The cycling count is an example of an indicator of degraded memory state retention. In some embodiments, each memory page, sector, or other unit of memory is cycled uniformly so that the memory cells on each memory page, sector, or other unit of memory can use the same write conditions.

When the indicator of degraded memory state retention is a number of lifetime cycles of the set operation performed on at least part of the array, then an increasing number of lifetime cycles of the set operation corresponds to an increasing indicator of degraded memory state retention.

When the indicator of degraded memory state retention is resistance value of the resistance state in the crystalline phase, then a decreasing resistance value corresponds to an increasing indicator of degraded memory state retention.

Figure 8:
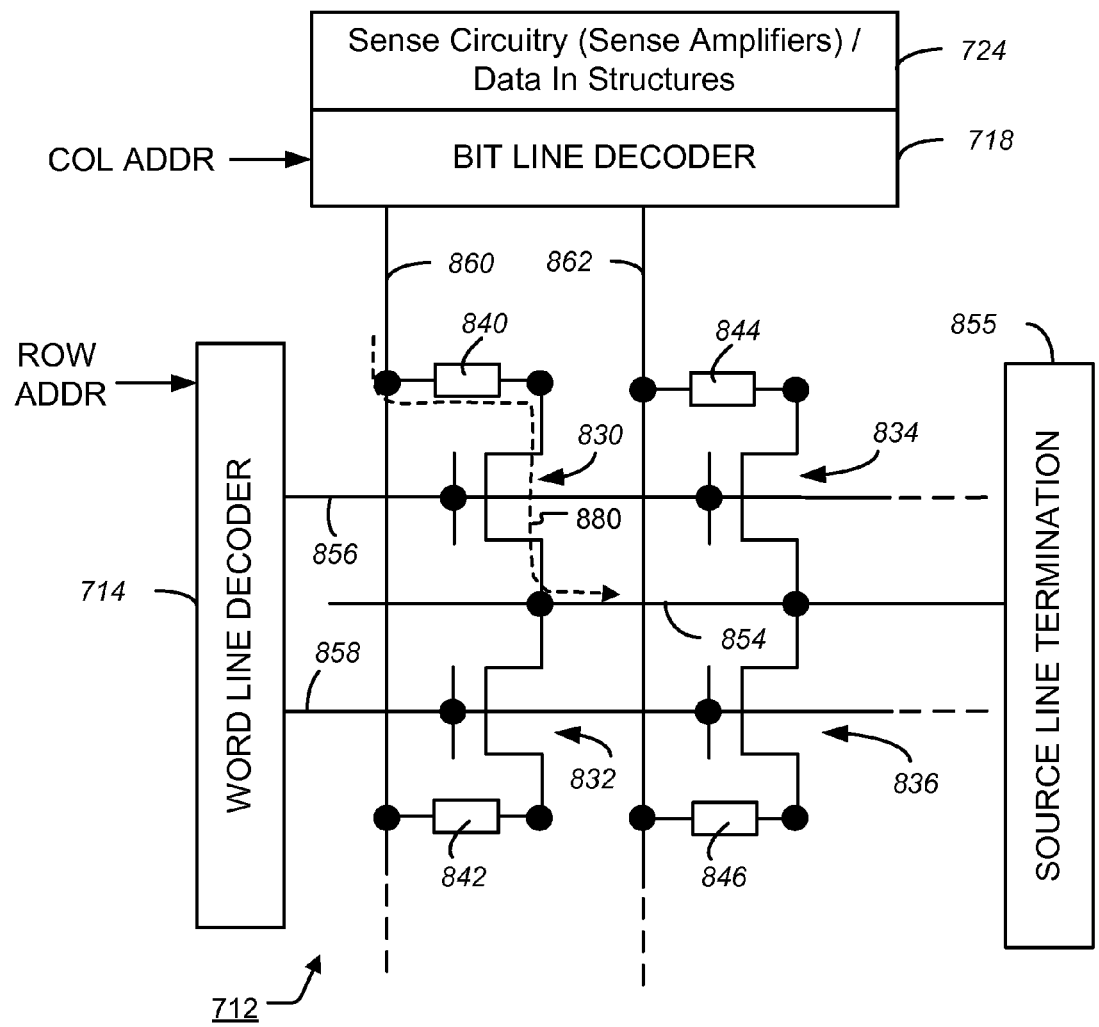
FIG. 8 is a simplified block diagram of an array of memory cells with improved control circuitry disclosed herein, and access circuitry.
Figure 9:
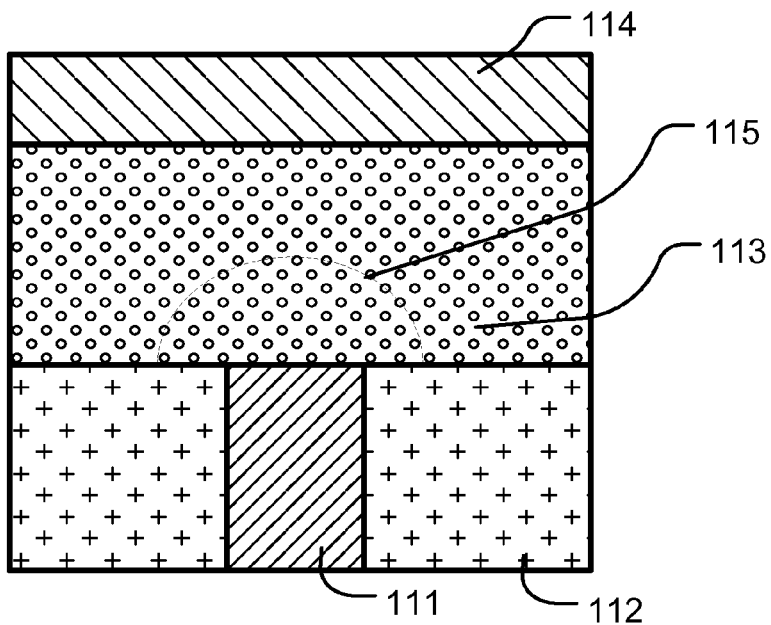
FIGS. 9-12 show various types of phase change memory cells in various embodiments.
Figure 10:
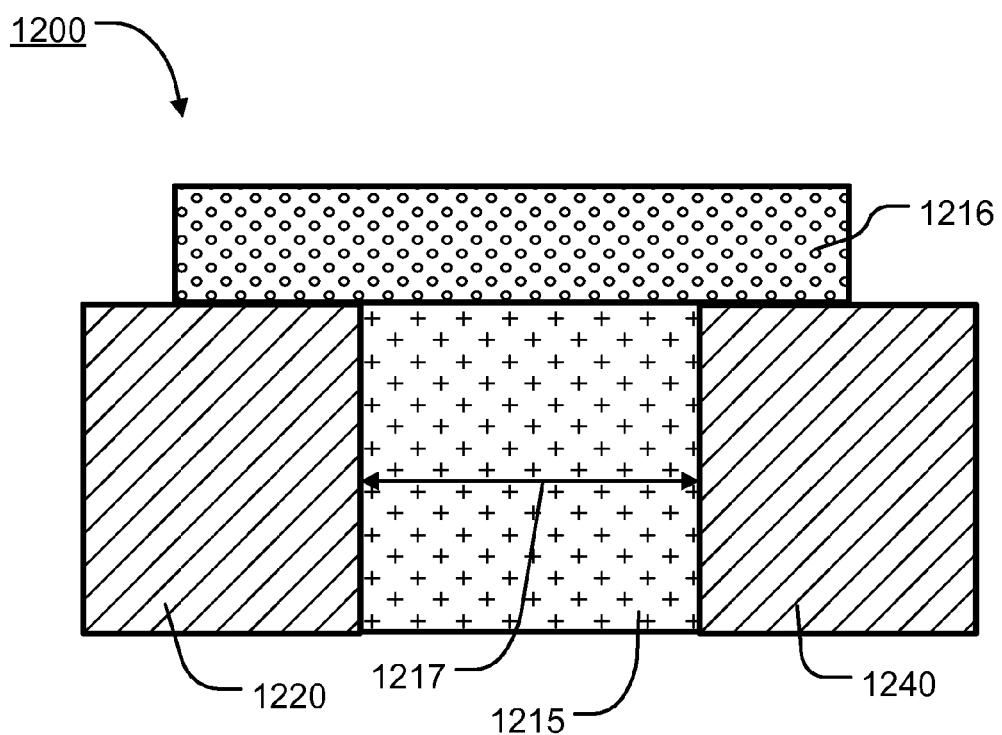
Figure 11:
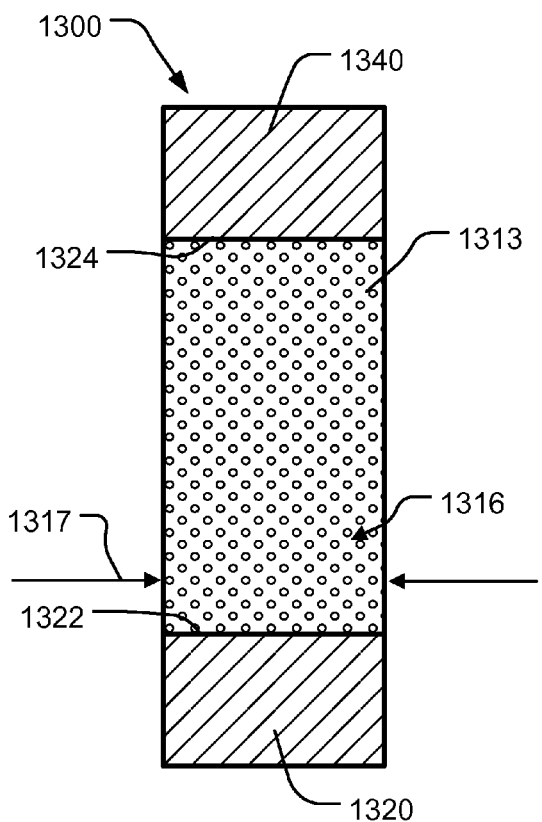
Figure 12:
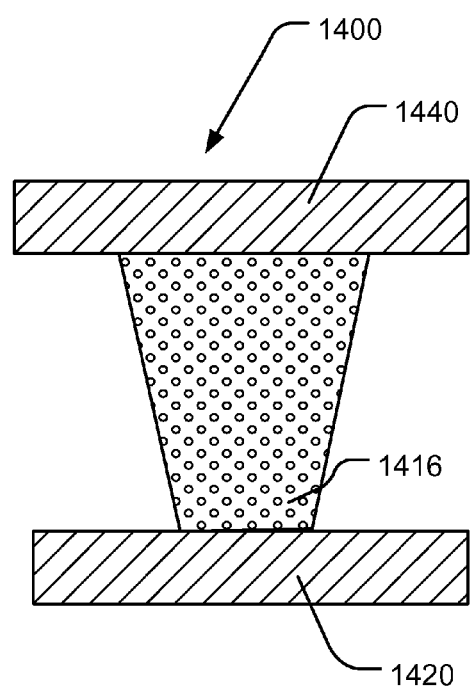

As shown in FIG. 8, each of the memory cells of array 712 includes an access transistor (or other access device such as a diode) and memory element having a phase change structure with a thin layer between an electrode and an oxide as described herein. In FIG. 8 four memory cells 830, 832, 834, 836 having respective memory elements 840, 842, 844, 846 are illustrated, representing a small section of an array that can include millions of memory cells.

Sources of each of the access transistors of memory cells 830, 832, 834, 836 are connected in common to source line 854 that terminates in a source line termination circuit 855, such as a ground terminal. In another embodiment the source lines of the access devices are not electrically connected, but independently controllable. The source line termination circuit 855 may include bias circuitry such as voltage sources and current sources, and decoding circuits for applying bias arrangements, other than ground, to the source line 854 in some embodiments.

A plurality of word lines including word lines 856, 858 extend in parallel along a first direction. Word lines 856, 858 are in electrical communication with word line decoder 714. The gates of access transistors of memory cells 830 and 834 are connected to word line 856, and the gates of access transistors of memory cells 832 and 836 are connected in common to word line 858.

A plurality of bit lines including bit lines 860, 862 extend in parallel in a second direction and are in electrical communication with bit line decoder 718. In the illustrated embodiment each of the memory elements are arranged between the drain of the corresponding access device and the corresponding bit line. Alternatively, the memory elements may be on the source side of the corresponding access device.

It will be understood that the memory array 712 is not limited to the array configuration illustrated in FIG. 8, and additional array configurations can also be used. Additionally, instead of MOS transistors, bipolar transistors or diodes may be used as access devices in some embodiments.

In operation, each of the memory cells in the array 712 stores data depending upon the resistance of the corresponding memory element. The data value may be determined, for example, by comparison of current on a bit line for a selected memory cell to that of a suitable reference current by sense amplifiers of sense circuitry 724. The reference current can be established so that a predetermined range of currents correspond to a logical "0", and a differing range of currents correspond to a logical "1".

Reading or writing to a memory cell of array 712, therefore, can be achieved by applying a suitable voltage to one of word lines 858, 856 and coupling one of bit lines 860, 862 to a voltage source so that current flows through the selected memory cell. For example, a current path 880 through a selected memory cell (in this example memory cell 830 and corresponding memory element 840) is established by applying voltages to the bit line 860, word line 856, and source line 854 sufficient to turn on the access transistor of memory cell 830 and induce current in path 880 to flow from the bit line 860 to the source line 854, or vice-versa. The level and duration of the voltages applied is dependent upon the operation performed, e.g. a reading operation or a writing operation.

In a reset (or program) operation of the memory cell 830, word line decoder 714 facilitates providing word line 856 with a suitable voltage pulse to turn on the access transistor of the memory cell 830. Bit line decoder 718 facilitates supplying a voltage pulse to bit line 860 of suitable amplitude and duration to induce a current to flow though the memory element 840, the current raising the temperature of the active region of the memory element 840 above the transition temperature of the phase change material and also above the melting temperature to place the phase change material of the active region in a liquid state. The current is then terminated, for example, by terminating the voltage pulses on the bit line 860 and on the word line 856, resulting in a relatively quick quenching time as the active region cools to a high resistance generally amorphous phase in the phase change material in the active region to establish a high resistance reset state in the memory cell 830.

In a set (or erase) operation of the selected memory cell 830, word line decoder 714 facilitates providing word line 856 with a suitable voltage pulse to turn on the access transistor of the memory cell 830. Bit line decoder 718 facilitates supplying a voltage pulse to bit line 860 of suitable amplitude and duration to induce a current to flow through the memory element 840, the current pulse sufficient to raise the temperature of the active region above the transition temperature and cause a transition in the phase change material in the active region from the high resistance generally amorphous condition into a low resistance generally crystalline condition, this transition lowering the resistance of the memory element 840 and setting the memory cell 830 to the low resistance state. The set operation can also comprise more than one pulse, for example using a pair of pulses.

In a read (or sense) operation of the data value stored in the memory cell 830, word line decoder 714 facilitates providing word line 856 with a suitable voltage pulse to turn on the access transistor of the memory cell 830. Bit line decoder 718 facilitates supplying a voltage to bit line 860 of suitable amplitude and duration to induce current to flow through the memory element 840 that does not result in the memory element undergoing a change in resistive state. The current on the bit line 860 and through the memory cell 830 is dependent upon the resistance of, and therefore the data state associated with, the memory cell. Thus, the data state of the memory cell may be determined by detecting whether the resistance of the memory cell 830 corresponds to the high resistance state or the low resistance state, for example by comparison of the current on bit line 860 with a suitable reference current by sense amplifiers of sense circuitry 724.

FIGS. 9-12 show various types of phase change memory cells in various embodiments.

The materials used in the embodiment described herein comprise a basis phase change material of $Ge_2Sb_2Te_5$. Other chalcogenides may be used as well. Chalcogens include any of the four elements oxygen (O), sulfur (S), selenium (Se), and Tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60%, and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording," SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

The first (bottom) and second (e.g., bit line) electrodes may comprise, for example, TiN or TaN. Alternatively, the first and second electrodes may each be W, WN, TiAlN or TaAlN.

The relatively narrow width (which in some embodiments is a diameter) of the first electrode results in an area of contact between the first electrode and the memory element that, in some embodiments, is less than the area of contact between the memory element and the top electrode. Thus current is concentrated in the portion of the memory element adjacent the first electrode, resulting in the active region in contact with or near the bottom electrode. The memory element also includes an inactive region, outside the active region, which is inactive in the sense that it does not undergo phase transitions during operation.

The basis phase change material of memory element in this example comprises $Ge_2Sb_2Te_5$. The basic material can be defined as the combination of elements selected as the phase change material, and deposited with a concentration profile that is characteristic of that material. For example, other basis phase change materials may include $Ge(x)Sb(2y)Te(x+3y)$, where x and y are integers (including 0). Other basic phase change materials other than GeSbTe-based materials can also be used, including GaSbTe system, which can be described as $Ga(x)Sb(x+2y)Te(3y)$, and x, y are integers. Alternatively, the basic phase change material can be selected from a $Ag(x)In(y)Sb2Te3$ system, where x, y decimal numbers that can be below 1.

In a reset operation of the memory cell, bias circuitry (See, for example, bias circuitry voltage and current sources of FIG. 7 with the accompanying controller) coupled to the first and second electrodes induces a current to flow between the first and second electrodes via the memory element sufficient to induce a high resistance generally amorphous phase in the phase change domains of the active region to establish a high resistance reset state in the memory cell.

Underlying access circuitry can be formed by standard processes as known in the art, and the configuration of elements of the access circuitry depends upon the array configuration in which the memory cells described herein are implemented. Generally, the access circuitry may include access devices such as transistors and diodes, word lines and sources lines, conductive plugs, and doped regions within a semiconductor substrate.

The first electrode and the dielectric layer can be formed, for example, using methods, materials, and processes as disclosed in U.S. patent application Ser. No. 11/764,678 filed on 18 Jun. 2007 entitled "Method for Manufacturing a Phase Change Memory Device with Pillar Bottom Electrode" (now U.S. Publication 2008/0191187), which is incorporated by reference herein. For example, a layer of electrode material can be formed on the top surface of access circuitry (not shown), followed by patterning of a layer of photoresist on the electrode layer using standard photolithographic techniques so as to form a mask of photoresist overlying the location of the first electrode. Next the mask of photoresist is trimmed, using for example oxygen plasma, to form a mask structure having sublithographic dimensions overlying the location of the first electrode. Then the layer of electrode material is etched using the trimmed mask of photoresist, thereby forming the first electrode having a sublithographic diameter. Next surrounding dielectric material is formed and planarized.

As another example, the first electrode and dielectric can be formed using methods, materials, and processes as disclosed in U.S. patent application Ser. No. 11/855,979 filed on 14 Sep. 2007 entitled "Phase Change Memory Cell in Via Array with Self-Aligned, Self-Converged Bottom Electrode and Method for Manufacturing" (now U.S. Publication 2009/0072215) which is incorporated by reference herein. For example, the dielectric can be formed on the top surface of access circuitry followed by sequentially forming an isolation layer and a sacrificial layer. Next, a mask having openings close to or equal to the minimum feature size of the process used to create the mask is formed on the sacrificial layer, the openings overlying the location of the first electrode. The isolation layer and the sacrificial layers are then selectively etched using the mask, thereby forming a via in the isolation and sacrificial layers and exposing a top surface of the dielectric layer. After removal of the mask, a selective undercutting etch is performed on the via such that the isolation layer is etched while leaving the sacrificial layer and the dielectric layer intact. A fill material is then formed in the via, which, due to the selective undercutting etch process, results in a self-aligned void in the fill material being formed within the via. Next, an anisotropic etching process is performed on the fill material to open the void, and etching continues until the dielectric layer is exposed in the region below the void, thereby forming a sidewall spacer comprising fill material within the via. The sidewall spacer has an opening dimension substantially determined by the dimensions of the void, and thus can be less than the minimum feature size of a lithographic process. Next, the dielectric layer is etched using the sidewall spacers as an etch mask, thereby forming an opening in the dielectric layer having a diameter less than the minimum feature size. Next, an electrode layer is formed within the openings in the dielectric layer. A planarizing process, such as chemical mechanical polishing CMP, is then performed to remove the isolation layer and the sacrificial layer and to form the first electrode.

A phase change structure is formed, comprising a basic phase change material $Ge_2Sb_2Te_5$. Sputtering is an example. Also, other deposition technologies can be applied, including chemical vapor deposition, atomic layer deposition and so on.

Next, a second electrode is formed and at back-end-of-line (BEOL) processing is performed to complete the semiconductor process steps of the chip. The BEOL processes can be standard processes as known in the art, and the processes performed depend upon the configuration of the chip in which the memory cell is implemented. Generally, the structures formed by BEOL processes may include contacts, inter-layer dielectrics and various metal layers for interconnections on the chip including circuitry to couple the memory cell to periphery circuitry. These BEOL processes may include deposition of dielectric material at elevated temperatures, such as depositing SiN at 400° C. or high density plasma HDP oxide deposition at temperatures of 500° C. or greater. As a result of these processes, control circuits and biasing circuits as shown in FIG. 7 are formed on the device.

In the mushroom cell, the current is concentrated by the bottom electrode, resulting in the active region being adjacent the bottom electrode. Bridge or pillar or pore structures are other configurations of phase change memory cell.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
    an array of phase change memory cells having an amorphous phase corresponding to a first resistance state and a crystalline phase corresponding to a second resistance state;
    a control circuit coupled to the array, the control circuit performing a reset operation and a set operation that change the resistance states of the array, the control circuit changing at least one parameter of at least one of each future reset operation and each future set operation, responsive to an indicator of degraded memory state retention of at least part of the array, wherein the control circuit changes a total energy applied to said at least part of the array as the indicator of degraded memory state retention increases.

2. The device of claim 1, wherein the indicator of degraded memory state retention is a number of lifetime cycles of the set operation performed on said at least part of the array.

3. The device of claim 1, wherein the control circuit changes a total period of applying energy to said at least part of the array as the indicator of degraded memory state retention increases.

4. The device of claim 1, wherein the control circuit changes a current applied to said at least part of the array as the indicator of degraded memory state retention increases.

5. The device of claim 1, wherein the control circuit causes the set operation to apply energy to said at least part of the array for a shorter total period as the indicator of degraded memory state retention increases.

6. The device of claim 1, wherein the control circuit causes the set operation to apply a lower current to said at least part of the array as the indicator of degraded memory state retention increases.

7. The device of claim 1, wherein the control circuit causes the reset operation to apply energy to said at least part of the array for a longer total period as the indicator of degraded memory state retention increases.

8. The device of claim 1, wherein the control circuit causes the reset operation to apply a higher current to said at least part of the array as the indicator of degraded memory state retention increases.

9. The device of claim 1, wherein the indicator of degraded memory state retention is resistance value of the second resistance state in the crystalline phase.

10. A method of operating a memory device, comprising:
    responsive to an indicator of degraded memory state retention of at least part of an array of phase change memory cells having an amorphous phase corresponding to a first resistance state and a crystalline phase corresponding to a second resistance state, changing at least one parameter of at least one of each future reset operation and each future set operation that changes the resistance states of the array, wherein said changing includes changing a total energy applied to said at least part of the array as the indicator of degraded memory state retention increases.

11. The method of claim 10, wherein the indicator of degraded memory state retention is a number of lifetime cycles of the set operation performed on said at least part of the array.

12. The method of claim 10, wherein said changing includes changing a total period of applying energy to said at least part of the array as the indicator of degraded memory state retention increases.

13. The method of claim 10, wherein said changing includes changing a current applied to said at least part of the array as the indicator of degraded memory state retention increases.

14. The method of claim 10, wherein said changing includes the set operation applying energy to said at least part of the array for a shorter total period as the indicator of degraded memory state retention increases.

15. The method of claim 10, wherein said changing includes the set operation applying a lower current to said at least part of the array as the indicator of degraded memory state retention increases.

16. The method of claim 10, wherein said changing includes the reset operation applying energy to said at least part of the array for a longer total period as the indicator of degraded memory state retention increases.

17. The method of claim 10, wherein said changing includes the reset operation applying a higher current to said at least part of the array as the indicator of degraded memory state retention increases.

18. The method of claim 10, wherein the indicator of degraded memory state retention is resistance value of the second resistance state in the crystalline phase.

* * * * *